(12) United States Patent
Benzing et al.

(10) Patent No.: US 6,303,267 B1
(45) Date of Patent: Oct. 16, 2001

(54) NEGATIVE-WORKING RADIATION-SENSITIVE MIXTURE FOR THE PRODUCTION OF A RECORDING MATERIAL WHICH IS IMAGEABLE BY HEAT OF INFRARED LASER BEAMS

(75) Inventors: Martin Benzing, Biebelnheim; Dieter Mohr, Appenheim; Holger Schembs, Mainz; Daniela Clausen, Wiesbaden, all of (DE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/413,319

(22) Filed: Oct. 6, 1999

(30) Foreign Application Priority Data

Oct. 13, 1998 (DE) ............................................... 198 47 033

(51) Int. Cl.⁷ ................................. G03F 7/11; G03C 5/00
(52) U.S. Cl. ........................ 430/270.1; 430/258; 430/259; 430/905; 430/909
(58) Field of Search ........................... 430/270.1, 275.1, 430/325, 523, 526, 541, 909, 913, 935, 258, 259, 260, 281.1, 273.1, 253, 252, 257

(56) References Cited

U.S. PATENT DOCUMENTS

| | | |
|---|---|---|
| 4,631,245 | 12/1986 | Pawlowski ............................. 430/175 |
| 4,693,958 | 9/1987 | Schwartz et al. ...................... 430/302 |
| 4,895,787 | 1/1990 | Platzer ................................... 430/253 |
| 5,049,476 | 9/1991 | Platzer ................................... 430/253 |
| 5,126,504 * | 6/1992 | Mueller-Hess et al. ................ 430/96 |
| 5,372,907 | 12/1994 | Haley et al. ............................ 430/157 |
| 5,466,557 | 11/1995 | Haley et al. ............................ 430/278 |
| 5,491,046 | 2/1996 | DeBoer et al. ......................... 430/302 |
| 5,725,994 * | 3/1998 | Kondo .................................... 430/270.1 |
| 6,080,523 * | 6/2000 | Vermeersch et al. .................. 430/270.1 |

FOREIGN PATENT DOCUMENTS

| | | |
|---|---|---|
| 0 152 819 | 8/1985 | (EP) . |
| 0 519 591 | 12/1992 | (EP) . |
| 0 557 138 | 8/1993 | (EP) . |
| 0 615 162 | 9/1994 | (EP) . |
| 0 740 208 | 10/1996 | (EP) . |
| 0 750 230 | 12/1996 | (EP) . |
| 0 772 089 | 5/1997 | (EP) . |
| 0 780 239 | 6/1997 | (EP) . |
| 0 803 773 | 10/1997 | (EP) . |
| 08062844-A * | 3/1996 | (JP) ................................. G03F/7/39 |
| 08328240-A * | 12/1996 | (JP) ................................. G03F/7/00 |

* cited by examiner

Primary Examiner—Janet Baxter
Assistant Examiner—Yvette M Clarke
(74) Attorney, Agent, or Firm—Foley & Lardner

(57) ABSTRACT

A negative-working, radiation-sensitive mixture is provided which contains an organic polymeric binder and a substance which converts radiant energy into heat, wherein the polymeric binder essentially comprises units of the formula (I):

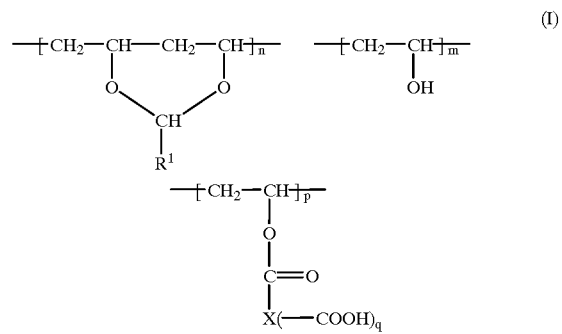

in which
$R^1$ is a hydrogen atom or a ($C_1$–$C_4$) alkyl radical,
X is a single bond or a (q+1)-valent radical of a ($C_4$–$C_{10}$) alkane, in which individual methylene groups may be replaced by hetero atoms, of a ($C_2$–$C_8$) alkene or of an isocyclic or heterocyclic, saturated or unsaturated, mono- or polycyclic ($C_6$–$C_{10}$) ring or ring system,
n is from 40 to 80 mol %,
m is from 15 to 30 mol %,
p is from 1 to 10 mol % and
q is an integer from 1 to 3, where q is equal to 1 when X is a single bond, and the polymeric binder has an acid number of from 5 to 150. A recording material comprising a substrate and a layer of this mixture, and a process for the production of a color proof are also provided.

25 Claims, No Drawings

NEGATIVE-WORKING RADIATION-SENSITIVE MIXTURE FOR THE PRODUCTION OF A RECORDING MATERIAL WHICH IS IMAGEABLE BY HEAT OF INFRARED LASER BEAMS

BACKGROUND OF THE INVENTION

1. Field of the Invention

The invention relates to a negative-working mixture which is sensitive to infrared or heat radiation and contains a polymeric binder and a substance which converts infrared radiation into heat, and a recording material comprising a substrate and a layer of this mixture. Depending on the choice of the substrate, offset printing plates or color proofs can be produced from the recording material after the imaging, which may be effected, for example, by means of an infrared laser.

2. Description of the Related Art

In the imaging with infrared lasers or thermal printing heads, negative-working layers as a rule require substantially shorter exposure times than positive-working ones. Nevertheless, only a small number of recording materials comprising a negative-working layer imageable by means of infrared or heat radiation are known to date.

EP-A 780,239 discloses a recording material for the production of offset printing plates. The negative-working layer of the recording material essentially comprises a substance which converts infrared radiation into heat, a polymeric binder which is insoluble in water but soluble in an aqueous alkaline medium and a phenol derivative. The phenol derivative contains from 4 to 8 benzene nuclei, at least one phenolic hydroxyl group and at least two groups of the formula —$CH_2OR^1$, in which $R^1$ is a hydrogen atom or an alkyl or an acyl group. Resins having phenolic hydroxyl groups or having olefinically unsaturated bonds are preferred as binders. Novolak resins, polyhydroxystyrenes, acrylic resins having phenolic groups and allyl methacrylate copolymers are mentioned in particular. After the infrared imaging, the recording material is developed with an aqueous alkaline solution.

EP-A 557,138 also describes a heat-sensitive, negative-working, radiation-sensitive mixtures. In one embodiment, they contain a polymer, in particular an epoxy resin, an epoxy novolak resin or an aliphatic, aromatic or heteroaromatic polyamine resin, a crosslinking agent and an acid or a compound which liberates an acid on heating. Diethylenetriamine, triethylenetetramine, diethylenepropylamine, ortho-, meta- and para-phenylenediamine, bis(4-amino-phenyl)methane and 2-methylimidazole are mentioned as crosslinking agents. In a second embodiment, the mixture contains, as essential components, a novolak, a photoinitiator which produces acid on exposure to radiation and a crosslinking agent which reacts with the novolak on heating in the presence of an acid. This photoinitiator is, for example, an ortho-nitrobenzaldehyde, an ester or an amide of 1,2-naphthoquinone-2-diazide-4-sulfonic acid or an onium salt. When this mixture is used, the recording material is first uniformly exposed so that acid is formed throughout the radiation-sensitive layer. The thermally induced crosslinking is then initiated by heat acting in a controlled manner. The unheated parts of the layer are then removed by means of an aqueous developer. For imagewise heating, an infrared laser diode, a $CO_2$ laser or an Nd-YAG laser (1060 nm) is preferably used. The mixtures serve primarily for the production of printed circuits.

The thermally imageable recording material according to EP-A 615,162 comprises a dimensionally stable substrate and a layer which contains a cationic polymer having pendant ammonium groups of the formula —$NR^1R^2R^3R^{4+}$ $X^-$ (R=H, alkyl, alkenyl or aryl), an IR-absorbing material and a dye. The material is imaged in general by means of an infrared laser or by means of laser diodes (750 to 880 nm). Those parts of the layer which are not exposed to the laser radiation are then removed by means of simple tap water or by means of an aqueous solution. The recording material is primarily intended for the production of color proofs. The substrate is then a transparent film. If images in the various primary colors (yellow, magenta, cyan and black) are arranged one on top of the other, a multicolor proof is obtained. In the production of offset printing plates, on the other hand, the substrate generally consists of metals, such as aluminum; in the production of printed circuits, it consists exclusively of paper which is impregnated with phenol resins or epoxy resins, or of polyester, polyimide or polystyrene.

U.S. Pat. No. 4,693,958 describes a recording material from which offset printing plates can be produced. It comprises a layer which can be cured by infrared radiation, for example from an Nd-YAG laser (1060 nm). The layer comprises a water-soluble or at least hydrophilic polyamide, a polymer having pendant quaternary ammonium groups or a styrene/vinylpyrrolidone copolymer. The cured parts of the layer are insoluble in water and subsequently accept the printing ink. Those parts of the layer which are not exposed to the infrared radiation are accordingly removed by means of water or an aqueous alkaline developer solution.

In addition to these directly negative-working systems, positive-negative reversal systems are also known. In these, a negative image is obtained from an actually positive-working material by an additional processing step, in particular a postbake. Examples of this are described in U.S. Pat. Nos. 5,372,907, 5,466,557 and 5,491,046, in which layers which contain a resol resin, a novolak resin, a latent Brönsted acid or an infrared absorber are imaged by means of infrared radiation (830 nm).

However, directly negative-working systems are more advantageous owing to the simpler processing. There is still a need for negative-working mixtures having as simple a composition as possible.

SUMMARY OF THE INVENTION

The present inventors have surprisingly discovered that polyvinyl acetal resins which still contain free, nonacetalated hydroxyl groups, some of which have been esterified with cyclic organic anhydrides so that the resins still contain additional carboxyl groups, have greatly reduced solubility in aqueous alkaline developers after the action of heat. The solubility difference is sufficient to result in imagewise differentiation in a corresponding recording layer.

In accordance with one aspect of the present invention, there is provided a directly negative-working radiation-sensitive mixture and a recording material which is produced therewith and can be imaged by means of radiation in the infrared range (700 to 1200 nm). Laser diodes having a wavelength of 830 nm or Nd-YAG lasers having a wavelength of 1060 nm are preferably used as radiation sources.

In accordance with another aspect of the present invention, there is provided a negative-working, radiation-sensitive mixture comprising a substance which converts radiant energy into heat and a polymeric binder having an acid number of from 5 to 150 comprising units of the formula (I):

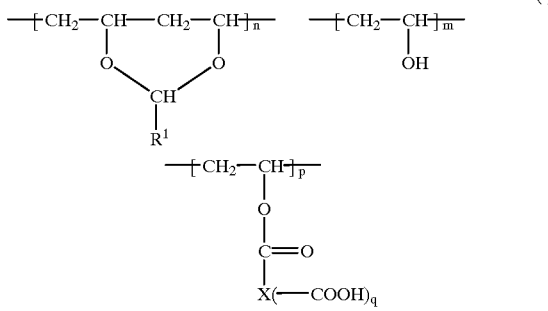

in which

R¹ is a hydrogen atom or a ($C_1$–$C_4$) alkyl radical,

X (i) is a single bond or (ii) a (q+1)-valent radical of a ($C_4$–$C_{10}$) alkane, in which individual methylene groups may be replaced by hetero atoms of
  (a) a ($C_2$–$C_8$) alkene or
  (b) of an isocyclic or heterocyclic, saturated or unsaturated, mono- or polycyclic ($C_6$–$C_{10}$) ring or ring system, n is from 40 to 80 mol %, m is from 15 to 30 mol %, p is from 1 to 10 mol % and q is an integer from 1 to 3, where q is 1 when X is a single bond.

In accordance with another aspect of the present invention, there is provided a recording material comprising a substrate and a layer of the radiation-sensitive mixture.

In accordance with another aspect of the present invention, there is provided a process of making a radiation-sensitive mixture, comprising mixing a polyvinyl acetal containing free hydroxyl groups and a dicarboxylic anhydride to form a polymeric binder containing carboxyl and free hydroxyl groups and dispersing a substance which is capable of converting infrared energy into heat with the polymeric binder.

DETAILED DESCRIPTION OF THE PREFERRED EMBODIMENTS

In formula (I) above, R¹ is preferably a propyl radical. X is preferably a single bond, an ethane-1,2-diyl, propane-1,2-diyl, propane-1,3diyl, 2-oxapropane-1,3-diyl, 2-methylpropane-1,3-diyl, butane-1,3-diyl, ethene-1,2-diyl, 1-methylethene-1,2-diyl, 1,2-dimethylethene-1,2-diyl, 1,2,2-trimethylcyclopentane-1,3-diyl, cyclo-hexene-1,2-diyl, ortho-phenylene, benzene-1,2,4-triyl, benzene-1,2,4,5-tetrayl, naphthalene-2,3-diyl, naphthalene-1,8-diyl, naphthalene-1,4,5,8-tetrayl, pyridine-2,3-diyl, pyrazine-2,3-diyl, furan-2,5-diyl, furan-2,5-diyl, thiophene-2,3-diyl or thiophene-2,5-diyl group or a bicyclo[2.2.1]hept-2-ene-5,6-diyl group. The groups X may additionally be substituted, for example by halogen atoms (Cl, Br), alkoxy groups or nitro groups.

The weight-average molecular weight, $M_w$, of the polymer of the formula (I) may vary within wide limits. It is in general from 5000 to 500,000, preferably from 20,000 to 300,000. The acid numbers of the polymer are in general in the range from 5 to 150, preferably from 30 to 120. In one aspect of the present invention, the monomer units are randomly distributed in the polymer and the polymer is therefore not, for example, a block copolymer.

The mixture according to the invention can, if required, also contain optional additives. The additives may comprise one or more of dyes, plasticizers, solubility inhibitors, solubility accelerators, reaction accelerators, residues of organic solvents, surfactants, compositions which ensure a level surface of the layer, lubricants, spacers, antistatic compositions and inert fillers. In a preferred embodiment, the mixture contains no components which are sensitive to radiation having a wavelength of 600 nm or less, so that no special conditions regarding the ambient light (such as yellow or red safety lighting) need be fulfilled during processing.

Starting materials from which the polymer of the formula (I) can be prepared are preferably polyvinyl acetals which still contain free hydroxyl groups, especially polyvinyl butyrals, as available under the name ®Mowital from Clariant AG or under the name ®Butvar from Monsanto Chem. Co. These can then be esterified with dicarboxylic anhydrides, such as maleic anhydride, citraconic anhydride, 2,3-dimethylmaleic anhydride, succinic anhydride, methylsuccinic anhydride, glutaric anhydride, 3-methylglutaric anhydride, camphoric anhydride, phthalic anhydride, hexahydrophthalic anhydride, cyclohexene1,2-dicarboxylic anhydride, naphthalene-2,3-dicarboxylic anhydride, furan-2,5-dicarboxylic anhydride, trimellitic anhydride or di- or polycyclic anhydrides formed by Diels-Alder addition of dienes with maleic anhydride. This gives polymers which also contain carboxyl groups in addition to free hydroxyl groups. Polymers comprising the units mentioned in the formula (I) are known. They are described in detail in EP-A 152,819 (same patent family as U.S. Pat. No. 4,631,245), as are processes for their preparation.

The polyvinyl acetals serving as starting material are in turn usually prepared from polyvinyl acetate, which is hydrolyzed under acidic or alkaline conditions and then acetalated with an aldehyde with elimination of water. In addition to containing the units mentioned in the formula (I), the polymeric binders used in the mixture according to the invention therefore unavoidably have a residual content of polyvinyl acetate units which generally accounts for up to about 6 mol %, in particular from 1 to 4 mol %, based on all monomer units in the binder.

The radiation-sensitive mixture preferably comprises a radiation-sensitive layer over a substrate. The amount of this binder is in general from 30 to 95, preferably from 45 to 70% by weight, based on the total weight of the nonvolatile components of the radiation-sensitive layer.

The component which is capable of converting IR radiation energy into heat may be a carbon black grade (for example ®Printex 25 from Degussa AG) or an infrared absorber or infrared dye (for example ®Pro-Jet 830 NP from Zeneca). Cyanine dyes, merocyanine dyes, infrared-absorbing indolenine dyes, indocyanine dyes, squarylium dyes, methine dyes, cyan dyes, pyrylium compounds and pentamethinethiopyrylium salts may also be used. Carbon blacks and squarylium dyes are generally preferred.

In a particularly preferred embodiment, the infrared-absorbing and heat-generating (colored) pigment is predispersed in a polymeric binder having the units mentioned in the formula (I).

The amount of the component which converts IR radiation into heat is in general from 2 to 70% by weight, preferably from 30 to 55% by weight, based in each case on the total weight of the nonvolatile components of the radiation-sensitive layer.

If required, the negative-working layer may also contain solubility inhibitors. Inter alia, acrylate polymers or other substances sparingly soluble or insoluble in aqueous alkaline solutions are suitable for this purpose. If these compounds are used in the radiation-sensitive mixture according to the invention, they are generally present in an amount of from 2 to 30% by weight, preferably from 4 to 12% by weight, based in each case on the weight of the nonvolatile components of the layer.

In addition, the layer may also contain solubility accelerators. Suitable solubility accelerators may simultaneously act as reaction accelerators. Solubility accelerators are preferably acids, such as phosphoric acid, trimellitic acid, nitrobenzenecarboxylic acids or p-toluenesulfonic acid, and also trihalomethyl-s-triazines, bistrihalomethyl-5-triazines or acid chlorides, such as 1,2-naphtho-quinone-2-diazide4-sulfonyl chloride and others. Naphthoquinonediazides are sensitive to UV radiation and visible light. The corresponding recording materials must therefore be processed in yellow safety light. The amount of these optional additives, which are present only if required, is in general from 0.5 to 25% by weight, preferably from 2 to 15% by weight, based in each case on the total weight of the nonvolatile components of the radiation-sensitive layer.

For the production of the recording material according to the invention, the radiation-sensitive mixture is generally applied to a suitable substrate. For this purpose, the mixture is generally dissolved in a solvent, for example butanone, tetrahydrofuran, propylene glycol monomethyl ether or propylene glycol monomethyl ether acetate, and applied as a thin layer to the substrate by pouring on, spin-coating or similar methods. The solvent is then removed from the layer, in particular by the use of heat and/or under reduced pressure.

Preferred substrates in radiation-sensitive recording materials from which offset printing plates are to be produced are metal sheets, bands or foils, in particular of aluminum or of an aluminum alloy, which can in general be pretreated in a conventional manner. In the case of aluminum substrates, such a pretreatment comprises in particular mechanical, chemical or electrochemical roughening, which may be followed by anodic oxidation and further treatments, for example with polyvinylphosphonic acid, alkali metal silicate, phosphate or polyacrylamide.

In recording materials for the production of color proofs, a transparent, flexible and dimensionally stable plastics film, in particular a film of polyester or polycarbonate, generally serves as a substrate material. Polyester films are preferred, in particular biaxially oriented and heat-set films, for example of polyethylene terephthalate (PET). The films are chosen so that they remain dimensionally stable at temperatures up to about 150° C. Their thickness is in general from 10 to 200 $\mu$m, preferably from 20 to 80 $\mu$m.

The imagewise exposure is preferably effected using IR lasers or IR laser diodes which emit radiation having a wavelength in the range from 700 to 1200 nm, preferably from 750 to 1100 nm. The recording material can be exposed in a flat-bed exposure unit or in an outer- or inner-drum exposure unit.

The unexposed parts of the layer are then removed by means of a suitable liquid developer. The developer solutions used are in general aqueous alkaline solutions which have a pH in the range from 8 to 14, preferably from 9 to 11, and may contain buffer salts, for example water-soluble alkali metal phosphates, silicates, borates, carbonates, acetates or benzoates. Wetting agents and small amounts of water-miscible organic solvents may be present therein as further components.

As an alternative to wet development, a developing film can be laminated with the imagewise exposed photosensitive layer. The unexposed parts of the layer adhere to the film more strongly than the exposed parts; during peel-apart, only these parts are therefore removed with said film. The peel-apart method has the advantage that no liquid waste products are obtained.

In another aspect of the present invention, there is provided a process for the production of a color proof, comprising the steps of:

(a) providing an ultraviolet radiation/visible light ("UV/VIS") transparent substrate, containing a first photopolymerizable layer colored with primary color dyes or pigments over a first side of the substrate and an adhesion-promoting layer over the first photopolymerizable layer, (b) applying a heat-sensitive layer according to the present invention over the second side of the transparent substrate, (c) laminating an image-receiving sheet over the adhesion-promoting layer, (d) imagewise exposing the heat-sensitive layer to infrared ("IR") radiation, (e) forming an exposure mask by removing unexposed parts of the heat-sensitive layer, (f) uniformly exposing the first photopolymerizable layer to UV/VIS radiation through the exposure mask and (g) peeling off the transparent substrate, the mask and exposed and polymerized portions of the first photopolymerizable layer from the image receiving-sheet and the unexposed portions of the first photopolymerizable layer; and, if required, (h) repeating of the steps (a) to (g) with a second photopolymerizable layer having a second primary color, the image-receiving sheet already containing an image in a first primary color.

The dimensionally stable substrate which is transparent to UV or visible light is preferably a biaxially oriented and heat-set plastics film, in particular a polyester film. The substrate is expediently adhesion pretreated on one side. The photopolymerizable layer arranged on the adhesion pretreated side of the substrate is generally colored in each case in a primary color (yellow, magenta, cyan or black). After the removal of the coating solvent (generally by heating to temperatures of up to about 120° C.), the weight of the photopolymerizable layer is usually from about 0.2 to 5.0 g/m$^2$, preferably from 0.3 to 3.0 g/m$^2$. Thereafter, preferably an aqueous solution is applied to the photopolymerizable layer to form an adhesion-promoting layer and dried again. After the drying, the weight of the adhesion-promoting layer is from about 2 to 30 g/m$^2$. Suitable mixtures for the photopolymerizable layer as well as for the adhesion-promoting layer on top of this layer are known and are described, for example, in EP-A 803,773, U.S. Pat. No. 4,895,787 or U.S. Pat. No. 5,049,476, incorporated in their entirety by reference.

The radiation and heat sensitive mixture according to the present invention is then applied to the back of the substrate, for example with the aid of a doctor blade, and the coating solvent is removed. The multilayer material thus produced is then laminated via the adhesion-promoting layer with an image-receiving material or sheet. Thereafter, IR laser radiation is allowed to act imagewise on the laminate from the side of the heat-sensitive layer and development is then carried out. The development can be effected, as described, with a liquid developer or by a peel-apart method with the aid of a development film. The exposed parts of the heat-sensitive layer then remain behind and form an image on the back of the transparent substrate. This image serves as an exposure mask in the subsequent uniform UV/VIS exposure. In the parts not covered by the mask, the UV/VIS radiation passes through the transparent substrate and initiates polymerization in the photopolymerizable layer colored in the respective color. The transparent substrate together with the mask and the polymerized parts of the photopolymerizable layer are then removed. A colored image remains behind on the image-receiving material.

A recording material of said type whose photopolymerizable layer is colored in another primary color can in turn be laminated with this colored image. After digitally controlled IR exposure and development of the heat-sensitive layer, followed by uniform UV/VIS exposure and removal of the substrate with the mask and the polymerized parts of the photopolymerizable layer colored in the other primary color, a two-color image is formed on the image-receiving material. The process can be repeated until a complete color proof has been formed from all images in primary colors.

The invention is explained in more detail by the following examples without being restricted thereto. Unless stated otherwise, all percentage data and ratios are to be understood as units by weight. "Pbw" means part(s) by weight.

EXAMPLE 1

A: Preparation of a Polymeric Binder "A" Suitable for the Radiation-sensitive Mixture 25 pbw of a polyvinyl butyral having a molecular weight $M_w$ of from about 170,000 to 180,000 and containing about 70% of vinyl butyral, 3% of vinyl acetate and 27% of vinyl alcohol units and 4 pbw of maleic anhydride were dissolved in 400 pbw of methyl ethyl ketone while heating. 1 pbw of triethylamine was added to the clear solution and the solution was refluxed for 5 h. After cooling, the solution was filtered and was added dropwise to 6000 pbw of demineralized water. The resulting white, fibrous product was filtered off with suction and dried to a constant weight under reduced pressure at 40° C.

B: Preparation of a Carbon Black Dispersion "B"

20 pbw of the polymer from section A were dissolved in 160 pbw of 1-methoxy-2-propanol (=propylene glycol monomethyl ether) and introduced into a dispersing vessel of a suitable size. 20 pbw of carbon black (®Printex 25 from Degussa AG) were stirred into the solution by means of a toothed disk. Thereafter, 180 pbw of glass beads (diameter about 1 mm) were added and dispersing was carried out with a grinding disk at about 5000 revolutions per mm for about 7 hours while cooling. The glass beads were then separated from the finished product by filtration.

C: Production of a Recording Material

For the production of the recording material according to the one aspect of the invention, a mixture of 15 pbw of carbon black dispersion (prepared as described in section B), 57 pbw of 1-methoxy-2-propanol and 28 pbw of methyl ethyl ketone were applied by spin-coating at about 100 revolutions per min, to a roughened, anodized and hydrophilized aluminum sheet. The recording material thus produced was then dried for 1 min at 100° C. in a drying oven. The weight of the radiation-sensitive layer was about 1 g/m².

D: Processing of the Recording Material

The recording material from section C was exposed in a Creo Trendsetter laser exposure unit with a thermal printing head (laser diode 830 nm) with a power of 8 W at 50 revolutions per min, which corresponded to an energy transfer of about 500 mJ/cm².

The development was then carried out in a cell with a commercial negative developer ®Ozasol EN 232 (pH about 9), which acted for 10 seconds on the imagewise exposed layer. Thereafter, the material was rubbed with a cotton wool pad and rinsed off with water. This produced a negative image. The resistance of the exposed layer to developer was adequate.

EXAMPLE 2

Example 1 was repeated, except that the substrate in this case was coated with a mixture of:

13.7 pbw of carbon black dispersion (as described in Example 1, section B),
0.3 pbw of 1,2-naphthoquinone-2-diazide-4-sulfonyl chloride,
58.0 pbw of 1-methoxy-2-propanol, and
28.0 pbw of methyl ethyl ketone.

The imagewise action of heat once again resulted in a negative image, and the resistance of the exposed layer to developer was better than that of the exposed layer in Example 1.

EXAMPLE 3

The procedure was as in Example 1, except that the coating solution comprised of:

1.50 pbw of carbon black dispersion (as described in Example 1, section B),
2.64 pbw of polymer A (as described in Example 1, section A),
0.06 pbw of para-toluenesulfonic acid,
67.80 pbw of 1-methoxy-2-propanol, and
28.00 pbw of methyl ethyl ketone The imagewise action of heat produced a negative image. The resistance of the exposed layer to developer was comparable with that of the exposed layer in Example 2.

EXAMPLE 4

The procedure was as in Example 1, except that a coating solution comprised of:

0.15 pbw of ®Pro-Jet 830 NP (from Zeneca),
2.49 pbw of polymer A (from Example 1),
0.30 pbw of 1,2-naphthoquinone-2-diazide4-sulfonyl chloride,
0.06 pbw of phosphoric acid,
69.00 pbw of 1-methoxy-2-propanol, and
28.00 pbw of methyl ethyl ketone A negative image formed. The resistance to developer corresponded to that of the exposed layer in Example 2.

EXAMPLE 5

E: Preparation of a Polymeric Binder "E" Suitable for the Radiation-sensitive Mixture According to Another Embodiment of the Present Invention A polymeric binder ("E") was prepared analogously to Example 1, section A. However, the starting materials used were a polyvinyl butyral having a lower molecular weight ($M_w$ from about 70,000 to 80,000) and trimellitic anhydride instead of maleic anhydride.

Example 1 was repeated but coating was carried out with the following solution:

6.00 pbw of carbon black dispersion B (from Example 1, section B),
1.74 pbw of polymer E,
0.06 pbw of p-toluenesulfonic acid, 64.20 pbw of 1-methoxy-2-propanol, and
28.00 pbw of methyl ethyl ketone.

A negative image formed. During the development, no rubbing but only rinsing was necessary after the action time. The resistance of the exposed layer to the developer corresponded to that of the exposed layer in Example 2.

EXAMPLE 6
Use of the Mixture According to an Embodiment of the Present Invention in a Color Proof System The starting photopolymerizable materials corresponded to the color proofs from EP-A 803,773 or U.S. Pat. No. 4,895,787 and 5,049,476, which represent an analogously operating color proof system.

In combination with the radiation-sensitive mixture according to the present invention, a color proof system which can be thermally and digitally imaged is obtained.

Starting materials

In each case, one of the following mixtures was applied to a front side of a 50 μm thick, biaxially oriented and heat-set polyester films (®Melinex 457), adhesion pretreated on one side:

| Components | Cyan | Magenta | Yellow | Black |
|---|---|---|---|---|
| Dipentaerythrityl pentaacrylate | 19.9 | 25.0 | 21.6 | 19.9 |
| 2,4-Bistrichloromethyl-6-biphenyl-4-yl-s-triazine | 5.1 | 6.1 | 5.4 | 5.3 |
| Polyvinyl formal (® Formvar 12/85) | 16.3 | 23.0 | 18.4 | 14.2 |
| Copolymer of a polyether-modified polysiloxane with 80% by weight of ethylene oxide and 20% by weight of propylene oxide units in the polyether moiety; viscosity 240 cSt/25° C., Mw about 6500 | 0.2 | 0.2 | 0.2 | 0.2 |
| ® Hostaperm Blue B2G (C.I. 74 160) | 9.7 | | | |
| Permanent Red FBB (C.I. 12 485) | | 12.9 | | |
| Permanent Yellow GR (C.I. 21 100) | | | 8.6 | |
| Carbon black (® Printex 25) | | | | 13.6 |
| Tetrahydrofuran | 398.6 | 363.9 | 382.4 | 378.8 |
| 4-Hydroxy-4-methyl-2-pentanone | 113.9 | 121.3 | 124.3 | 123.1 |
| 1-Methoxy-2-propanol | 360.6 | 326.5 | 353.7 | 331.5 |
| γ-Butyrolactone | 75.9 | 121.3 | 86.0 | 13.6 |

The pigments were dispersed with a part of the binder and the γ-butyrolactone. The mean particle size was less than 200 nm.

The coated films were dried in a drying tunnel at temperatures up to 110° C. to form a photopolymerizable layer. The layer weight was from 0.6 to 0.8 g/m².

The following solution for the adhesion-promoting layer was applied to the dry photopolymerizable layer:
50.0 pbw of 95:5 vinyl acetate/crotonic acid copolymer
0.16 pbw of pyrogenic silica (mean particle size 40 nm),
252 pbw of water,
24.0 pbw of ethanol and
5.0 pbw of 25% strength ammonia water.

The coated films were dried in a drying tunnel at temperatures of 100° C. The layer weight was 6.5 g/m².

Coating of the Radiation-sensitive Mixture According to an Embodiment of the Present the Invention The following coating solution was then applied to the back side of the substrate by means of a doctor blade apparatus and was dried for 1 min at about 100° C. in a drying oven (layer weight thereafter was about 1.4 g/m²):
31.20 pbw of carbon black dispersion B (from Example 1, section B),
0.96 pbw of polymer E (from Example 5),
0.16 pbw of para-toluenesulfonic acid,
0.64 pbw of ®Tint-Ayd PC 9298 (from Daniel Products),
37.34 pbw of 1-methoxy-2-propanol, and
29.70 pbw of methyl ethyl ketone.

Processing of the Finished Recording Material a) An image-receiving sheet was laminated to the adhesion-promoting layer over a cyan recording material (i.e., a photopolymerizable layer) on a polyester substrate.

b) The radiation sensitive layer (i.e., the heat-sensitive or black masking layer according to an embodiment of the present invention) formed on the back of the polyester substrate was then exposed in a Creo Trendsetter laser exposure unit with a thermal printing head (laser diode 830 nm) with a power of 8 W at 50 revolutions per min, which corresponds to an energy transfer of about 500 mJ/cm².

c) Development was then carried out with a commercial negative developer ®Ozasol EN 232, which has a pH of about 9, for about 10 seconds, followed by rubbing with a cotton wool pad and rinsing off with water. A negative image was formed as a mask on the color proof (i.e., on the back side of the polyester substrate). The resistance of the exposed layer to developer was very good. Alternatively, in addition to being achieved by the liquid developer, development could also be achieved by applying adhesive films and peeling them off again (i.e., by the peel-apart method).

d) After development of the digitally exposed image (i.e., the black mask on the back of the substrate), floodlight exposure of the cyan photopolymerizable layer to UV light (1000 W, about 20 s) was effected through the resulting black mask, and the polyester substrate was removed together with the mask and the nonimage parts of the cyan photopolymerizable layer. An image in the color cyan, which corresponded to the digitally exposed pattern, was obtained. By repeating steps a) to d) with the other process colors (i.e., magenta, yellow and black) with the use of the corresponding digital exposure data and floodlight exposure times, it was possible to obtain a thermally and digitally exposed color proof.

While the invention is susceptible to various modifications and alternative forms, specific embodiments have been shown by way of example in detail herein. However, it should be understood that the invention is not limited to the particular forms disclosed. Rather, the invention covers all modifications, equivalents, and alternatives falling within the spirit and scope of the invention as defined in the appended claims.

We claim:

1. A negative-working, radiation-sensitive mixture comprising a substance which converts radiant energy into heat and a polymeric binder having an acid number of from 5 to 150, consisting essentially of units of the formula (I):

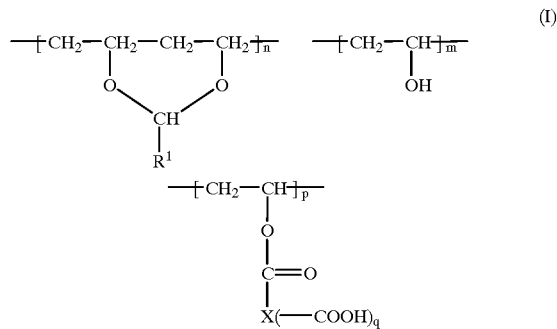

in which

R$^1$ is a hydrogen atom or a (C$_1$–C$_4$) alkyl radical,

X (i) is a single bond or
(ii) a (q+1)-valent radical
(a) of a (C$_4$–C$_{10}$) alkane, in which individual methylene groups may be replaced by hetero atoms,
(b) of a (C$_2$–C$_8$) alkene or
(c) of an isocyclic or heterocyclic, saturated or unsaturated, mono- or polycyclic (C$_6$–C$_{10}$) ring or ring system, n is from 40 to 80 mol %, m is from 15 to 30 mol %, p is from 1 to 10 mol %, q is an integer from 1 to 3, where q is 1 when X is a single bond; and wherein the mixture does not contain components which are sensitive to radiation having a wavelength of 600 nm or less.

2. The radiation-sensitive mixture as claimed in claim 1, wherein the weight-average molecular weight, M$_w$, of the polymeric binder of the formula (I) is from 5000 to 500,000.

3. The radiation-sensitive mixture as claimed in claim 2, wherein the weight-average molecular weight, M$_w$, of the polymeric binder of the formula (I) is from 20,000 to 300,000.

4. The radiation-sensitive mixture as claimed in claim 1, wherein the polymeric binder has a residual content of polyvinyl acetate units which accounts for up to about 6 mol %, based on all monomer units in the binder.

5. The radiation-sensitive mixture as claimed in claim 4, wherein the polymeric binder has a residual content of polyvinyl acetate units which accounts for from 1 to 4 mol %, based on all monomer units in the binder.

6. A radiation-sensitive layer comprising the radiation-sensitive mixture as claimed in claim 1, wherein the amount of the binder is from 30 to 95 percent by weight based on the total weight of the nonvolatile components of the radiation-sensitive layer.

7. The radiation-sensitive layer as claimed in claim 6, wherein the amount of the binder is from 45 to 70 percent by weight based on the total weight of the nonvolatile components of the radiation-sensitive layer.

8. The radiation-sensitive mixture as claimed in claim 1, wherein the radiant energy comprises infrared radiant energy and the substance which converts infrared radiant energy into heat comprises an infrared-absorbing and heat-generating pigment predispersed in a polymeric binder having the units stated in the formula (I).

9. The radiation-sensitive mixture as claimed in claim 1, wherein radiant energy comprises infrared radiant energy and the substance which converts infrared radiant energy into heat comprises carbon black, a cyanine dye, a merocycanine dye, an infrared-absorbing indolenine dye, an indocyanine dye, a squarylium dye, a methine dye, a cyan dye, a pyrylium compound or a pentamethinethiopyrylium salt.

10. A radiation-sensitive layer comprising the radiation-sensitive mixture as claimed in claim 9, wherein the amount of the substance which converts infrared radiation into heat is from 2 to 70 percent by weight based on the total weight of the nonvolatile components of the radiation-sensitive layer.

11. The radiation-sensitive layer as claimed in claim 10, wherein the amount of the substance which converts infrared radiation into heat is from 30 to 55 percent by weight based on the total weight of the nonvolatile components of the radiation-sensitive layer.

12. A radiation-sensitive layer comprising the radiation-sensitive mixture as claimed in claim 1, and further comprising a solubility inhibitor in an amount of from 2 to 30 percent by weight based on the weight of the nonvolatile components of the radiation-sensitive layer.

13. The radiation-sensitive layer as claimed in claim 12, comprising the solubility inhibitor in an amount of from 4 to 12 percent by weight based on the weight of the nonvolatile components of the radiation-sensitive layer.

14. A radiation-sensitive layer comprising the radiation-sensitive mixture as claimed in claim 1, and further comprising a compound which acts as a solubility accelerator and a reaction accelerator.

15. The radiation-sensitive layer as claimed in claim 14, wherein the compound which acts as the solubility accelerator and the reaction accelerator comprise one or more of:

a) an acid
b) a trihalomethyl-s-triazine,
c) a bistrihalo-methyl-s-triazine or
d) an acid chloride, in an amount of from 0.5 to 25 percent by weight based on the total weight of the nonvolatile components of the radiation-sensitive layer.

16. The radiation-sensitive layer as claimed in claim 15, wherein:

the compound which acts as the solubility accelerator and the reaction accelerator comprise from 2 to 15 percent by weight based on the total weight of the nonvolatile components of the radiation-sensitive layer;

the acid comprises phosphoric acid, trimellitic acid, nitro-benzenecarboxylic acid or p-toluenesulfonic acid; and the acid chloride comprises 1,2-naphthoquinone-2-diazide-4-sulfonyl chloride.

17. A recording material comprising a substrate and a radiation-sensitive layer, wherein the layer comprises the radiation-sensitive mixture as claimed in claim 1.

18. The recording material as claimed in claim 17, wherein the substrate is a metal sheet, band or foil suitable for a production of offset printing plates.

19. The recording material as claimed in claim 18, wherein the metal comprises a pretreated, aluminum or a pretreated aluminum alloy.

20. The recording material as claimed in claim 17, wherein the substrate is a transparent, flexible and dimensionally stable plastic film suitable for a production of color proofs.

21. The recording material as claimed in claim 20, wherein the plastic film comprises a polyester or a polycarbonate film.

22. A process of making a radiation-sensitive mixture, comprising:

mixing a polyvinyl acetal containing free hydroxyl groups and a dicarboxylic anhydride to form the polymeric binder as claimed in claim 1 containing carboxyl and free hydroxyl groups; and dispersing a substance which is capable of converting infrared energy into heat with the polymeric binder.

23. The process as claimed in claim 22, wherein:

the polyvinyl acetal comprises a polyvinyl butyral;

the substance which is capable of converting infrared energy into heat comprises carbon black;

the step of mixing comprises dissolving the polyvinyl acetal and the dicarboxylic anhydride in a first solvent while heating, and subsequently filtering a resulting first solution to form the polymeric binder;

the step of dispersing comprises dissolving the polymeric binder in a second solvent and introducing the substance which is capable of converting infrared energy into heat into a resulting second solution; and further comprising coating the radiation-sensitive mixture on a substrate to form a radiation and heat sensitive layer.

24. A process for producing a color proof, comprising the steps of:

(a) providing an ultraviolet radiation and visible light transparent substrate, containing a first photopolymerizable layer colored with first primary color dyes or pigments over a first side of the substrate and an adhesion-promoting layer over the first photopolymerizable layer;

(b) applying a negative-working, radiation-sensitive mixture over a second side of the transparent substrate, to form a heat-sensitive layer, the mixture comprising:
a substance which converts radiant energy into heat and
a polymeric binder having an acid number of from 5 to 150 comprising units of the formula (I):

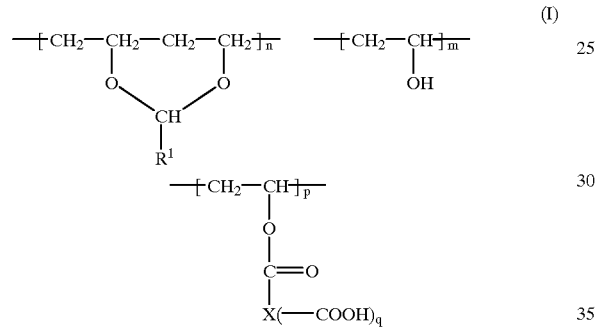
(I)

in which $R^1$ is a hydrogen atom or a $(C_1-C_4)$ alkyl radical,

X (i) is a single bond or (ii) a (q+1)-valent radical
  (A) of a $(C_4-C_{10})$ alkane, in which individual methylene groups may be replaced by hetero atoms,
  (B) of a $(C_2-C_8)$ alkene or
  (C) of an isocyclic or heterocyclic, saturated or unsaturated, mono- or polycyclic $(C_6-C_{10})$ ring or ring system, n is from 40 to 80 mol %, m is from 15 to 30 mol %, p is from 1 to 10 mol % and q is an integer from 1 to 3, where q is 1 when X is a single bond;

(c) laminating an image-receiving sheet over the adhesion-promoting layer;

(d) imagewise exposing the heat-sensitive layer to infrared radiation;

(e) forming an exposure mask by removing unexposed parts of the heat-sensitive layer;

(f) uniformly exposing the first photopolymerizable layer to ultraviolet radiation or visible light radiation through the exposure mask; and (g) peeling off the transparent substrate, the mask and exposed and polymerized portions of the first photopolymerizable layer from the image receiving-sheet containing unexposed portions of the first photopolymerizable layer.

25. The process as claimed in claim 24, further comprising repeating steps (a) to (g) with a second photopolymerizable layer having a second primary color, wherein said image-receiving sheet already contains an image in a first primary color.

* * * * *